United States Patent
Sun et al.

(10) Patent No.: US 8,508,221 B2
(45) Date of Patent: Aug. 13, 2013

(54) TWO-AXIS MAGNETIC FIELD SENSOR HAVING REDUCED COMPENSATION ANGLE FOR ZERO OFFSET

(75) Inventors: Jijun Sun, Chandler, AZ (US); Phillip Mather, Maricopa, AZ (US); Srinivas Pietambaram, Gilbert, AZ (US); Jon Slaughter, Tempe, AZ (US); Renu Whig, Chandler, AZ (US); Nicholas Rizzo, Gilbert, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 334 days.

(21) Appl. No.: 12/870,970

(22) Filed: Aug. 30, 2010

(65) Prior Publication Data
US 2012/0049843 A1    Mar. 1, 2012

(51) Int. Cl.
*G01R 33/02* (2006.01)
*H01R 43/00* (2006.01)

(52) U.S. Cl.
USPC .......................................... 324/249; 324/252

(58) Field of Classification Search
None
See application file for complete search history.

(56) References Cited

U.S. PATENT DOCUMENTS

| | | | |
|---|---|---|---|
| 6,201,672 B1 | 3/2001 | Pinarbasi | |
| 7,270,896 B2* | 9/2007 | Parkin | 428/811.1 |
| 7,446,982 B2 | 11/2008 | Gill | |
| 7,564,658 B2 | 7/2009 | Zhang et al. | |
| 7,583,481 B2 | 9/2009 | Zhang et al. | |
| 7,602,033 B2 | 10/2009 | Zhao et al. | |
| 2006/0017081 A1* | 1/2006 | Sun et al. | 257/295 |
| 2009/0279212 A1 | 11/2009 | Engel et al. | |
| 2011/0086439 A1* | 4/2011 | Choi | 438/3 |

OTHER PUBLICATIONS

International Search Report issued Jan. 5, 2012 in PCT/US2011/047113.
The International Bureau of WIPO, PCT, Notification Concerning Transmittal of International Preliminary Report on Patentability (Chapter 1 of the Patent Cooperation Treaty) in International Application No. PCT/US2011/047113, mailed Mar. 14, 2013.

* cited by examiner

*Primary Examiner* — Vinh Nguyen
(74) *Attorney, Agent, or Firm* — Ingrassia Fisher & Lorenz, P.C.

(57) ABSTRACT

A sensor and fabrication process are provided for forming reference layers with substantially orthogonal magnetization directions having zero offset with a small compensation angle. An exemplary embodiment includes a sensor layer stack of a magnetoresistive thin-film based magnetic field sensor, the sensor layer stack comprising a pinning layer; a pinned layer including a layer of amorphous material over the pinning layer, and a first layer of crystalline material over the layer of amorphous material; a nonmagnetic coupling layer over the pinned layer; a fixed layer over the nonmagnetic coupling layer; a tunnel barrier over the fixed layer; and a sense layer over the nonmagnetic intermediate layer. Another embodiment includes a sensor layer stack where a pinned layer including two crystalline layers separated by a amorphous layer.

10 Claims, 7 Drawing Sheets

→ FIXED (REFERENCE) LAYER MAGNETIZATION DIRECTION
⇨ PINNED (LARGE MOMENT) LAYER MAGNETIZATION DIRECTION

TWO-AXIS MAGNETIC FIELD SENSOR HAVING REDUCED COMPENSATION ANGLE FOR ZERO OFFSET

TECHNICAL FIELD

The present invention generally relates to the field of magnetoelectronic devices and more particularly to CMOS-compatible magnetoelectronic field sensors used to sense magnetic fields.

BACKGROUND

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications generally consist of anisotropic magnetoresistance (AMR) based devices. In order to arrive at the required sensitivity and reasonable resistances that mesh well with CMOS, the sensing units of such sensors are generally in the order of square millimeters in size. For mobile applications, such AMR sensor configurations are costly, in terms of expense, circuit area, and power consumption.

Other types of sensors, such as magnetic tunnel junction (MTJ) sensors and giant magnetoresistance (GMR) sensors, have been used to provide smaller profile sensors, but such sensors have their own concerns, such as inadequate sensitivity and being effected by temperature changes. To address these concerns, MTJ sensors and GMR sensors have been employed in a Wheatstone bridge structure to increase sensitivity and to eliminate temperature dependent resistance changes. Indeed, two-axis magnetic field sensors have been developed for electronic compass applications to detect the earth's field direction by using a Wheatstone bridge structure for each sense axis. However, such field sensors typically include two opposite pinning directions for each sense axis, resulting in four different pinning directions which must be individually set for each circuit utilizing a magnet array with complex and unwieldy magnetization techniques, or employ a thick NiFe shield/flux concentrating layer to direct the local direction of a lower intermediate field requiring additional process complexity. US patent application publication 2009/0279212 describes a process for generating multiple pinning directions in bulk wafer, and a Wheatstone bridge structure with a single pinning direction for each sense axis. The different pinning directions are typically set during an anneal process, but may have variations across a wafer and from device to device which result in bridge output with an undesirable offset. An average offset can be corrected by requiring a compensation angle in the orientation of the patterned devices of, for example, 3.5 degrees to achieve the zero offset. However, the offset variation remains a problem and may increase with the compensation angle; therefore, minimizing this compensation angle for zero offset is important for minimizing the standard deviation of offset.

Accordingly, a need exists for an improved sensor design and fabrication process for forming reference layers with substantially orthogonal magnetization directions having zero offset with a small compensation angle. There is also a need for a dual-axis sensor that can be efficiently and inexpensively constructed as an integrated circuit structure for use in mobile applications. There is also a need for an improved magnetic field sensor and fabrication to overcome the problems in the art, such as outlined above. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A sensor and fabrication process are provided for forming reference layers with substantially orthogonal magnetization directions having zero average offset, a small sensor-to-sensor variation in offset, and small offset variation cross wafer with a small compensation angle in the orientation of the devices.

An exemplary embodiment includes a magnetoresistive thin-film magnetic field sensor comprising an antiferromagnetic pinning layer; a pinned layer including an amorphous ferromagnetic layer having a thickness in the range of 2 to 15 Angstroms over the pinning layer, and a first crystalline ferromagnetic layer over the amorphous ferromagnetic layer; a nonmagnetic coupling layer over the pinned layer; a ferromagnetic fixed layer over the nonmagnetic coupling layer; a dielectric tunnel barrier layer over the fixed layer; and a ferromagnetic sense layer over the dielectric tunnel barrier layer.

In another exemplary embodiment, the structure described immediately above includes a second crystalline ferromagnetic layer formed between the antiferromagnetic pinning layer and the amorphous ferromagnetic layer.

In yet another exemplary embodiment, a magnetoresistive thin-film magnetic field sensor comprising two or more reference layer magnetization directions, comprising: a substrate; an insulating layer over the substrate; a first sensor layer stack over the insulating layer, the first sensor layer stack comprising a first pinning layer over the insulating layer; a first pinned layer including a first amorphous ferromagnetic layer having a thickness in the range of 2 to 15 Angstroms over the first pinning layer, and a first crystalline ferromagnetic layer over the amorphous ferromagnetic layer; a first nonmagnetic coupling layer over the first crystalline ferromagnetic pinned layer; a first ferromagnetic fixed layer over the first nonmagnetic coupling layer; a first dielectric tunnel barrier layer over the first ferromagnetic fixed layer; and a first ferromagnetic sense layer over the first dielectric tunnel barrier layer; a second sensor layer stack over the insulating layer, comprising a second pinning layer over the second insulating layer; a second pinned layer including a second amorphous ferromagnetic layer having a thickness in the range of 2 to 15 Angstroms over the second pinning layer, and a second crystalline ferromagnetic layer over the second amorphous ferromagnetic layer; a second nonmagnetic coupling layer over the second pinned layer; a second ferromagnetic fixed layer over the second nonmagnetic coupling layer; a second dielectric tunnel barrier layer over the second ferromagnetic fixed layer; and a second ferromagnetic sense layer over the second dielectric tunnel barrier layer; wherein the first sensor layer stack has a first shape anisotropy defining a first reference direction, and wherein the second sensor stack has a second shape anisotropy defining a second reference direction that is different from the first reference direction.

In still another exemplary embodiment, a method for fabricating a magnetoresistive thin-film based magnetic field sensor having two or more reference layer directions, comprises providing a substrate; forming an insulating layer over the substrate; forming a sensor layer stack over the insulating layer, the sensor layer stack comprising a pinning layer formed over the insulating layer; a pinned layer including an amorphous ferromagnetic layer having a thickness in the range of 2 to 15 Angstroms formed over the pinning layer, and a crystalline ferromagnetic layer formed over the amorphous ferromagnetic layer; a nonmagnetic coupling layer formed over the pinned layer; a ferromagnetic fixed layer formed over the nonmagnetic coupling layer; a dielectric tunnel barrier layer formed over the ferromagnetic fixed layer; and a ferromagnetic sense layer formed over the dielectric tunnel barrier layer; selectively etching the sensor layer stack to form a first electrode stack and a second electrode stack, where the first electrode stack has a first shape anisotropy to set a first reference direction, and where the second electrode stack has a second shape anisotropy to set a second reference direction; applying a saturating field substantially parallel to the substrate that is oriented between the first and second reference directions until each reference layer structure of the first and second electrode stacks has a magnetization that is substantially aligned with the saturating field; and removing the saturating field to allow the first shape anisotropy to set the magnetization of the reference layer structure of the first electrode stack, and to allow the second shape anisotropy to set the magnetization of the reference layer structure of the second electrode stack.

BRIEF DESCRIPTION OF THE DRAWINGS

The present invention will hereinafter be described in conjunction with the following drawing figures, wherein like numerals denote like elements.

DETAILED DESCRIPTION

Figure 1:
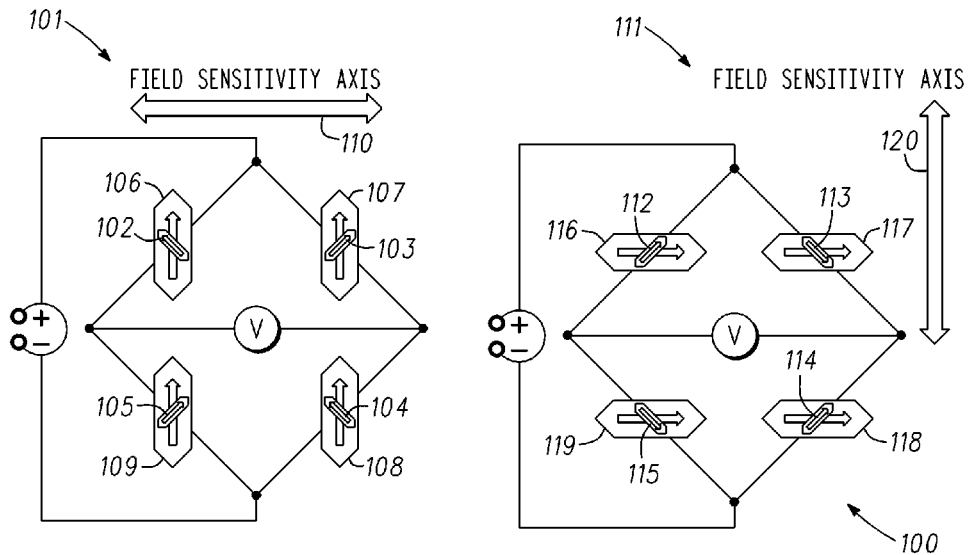
FIG. 1 is an electronic compass structure which uses differential sensors formed from two bridge structures with unshielded MTJ sensors.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

During the course of this description, like numbers are used to identify like elements according to the different figures that illustrate the various exemplary embodiments.

A method and structure are described for providing multi-axis pinning on a bulk wafer which may be used to form an integrated circuit sensor with different reference layers having substantially orthogonal pinning directions set with a single pinning material deposition and bulk wafer setting procedure, and fabricated with a pinned layer having two or more layers of specific materials resulting in a reduced compensation angle for a zero offset, and a reduced offset deviation. The reference layers are separated from a sensing element (or free layer) by a tunneling barrier, the reference layers comprising a synthetic antiferromagnet (SAF) structure, where the pinned layer next to the pinning layer is separated from the fixed layer next to the tunneling barrier by a coupling layer. In one exemplary embodiment, the pinned layer includes a layer of Cobalt and Iron (CoFe) material adjacent the coupling layer and a layer of Cobalt, Iron, and Boron (CoFeB) material adjacent the pinning layer. In another exemplary embodiment, the pinned layer includes two layers of CoFe material separated by a layer of CoFeB material. Both embodiments provide the pinned layer with improved soft magnetic characteristics, for examples small cocerivty Hc, better squareness of hysteresis loop, less openness at hard axis hysteresis loop, and low intrinsic anisotropy field. Since the procedure of setting multiple pinning directions was an anneal process during which there is no magnetic field applied, the more soft magnetic characteristic the pinned layer has, the less deviation the pinning direction has. The pinning direction deviation is one of the sources responsible for the offset deviation.

As a preliminary fabrication step, a stack of one or more layers of ferromagnetic and antiferromagnetic materials are etched into shaped reference layers having a two-dimensional shape with a high aspect ratio, where the shape provides a distinction for the desired magnetization direction for each reference layer. Depending on the materials and techniques used, the final magnetization direction may be oriented along the short axis or the long axis of the shaped layer. For example, if the pinned SAF layer is formed with a slight imbalance and patterned into micron-scale dimensions, the magnetization will direct along the short axis. As will be appreciated by those skilled in the art, the SAF embodiment provides a number of benefits related to the use of pinned-SAF reference layers in magnetoelectronic devices. In other embodiments, by controlling the thicknesses and shape of the pinned SAF layers, the final magnetization may be directed along the long axis. Using shape anisotropy, different magnetization directions are induced in the reference layers with different shape orientation. In selected embodiments, the patterned reference layers are set first in the presence of an orienting field that is aligned between the desired magnetization directions for the reference layers. This orienting field is removed before the samples are heated. The heating temperature has to be high enough to generating a high enough pinning field from the pinning layer next to the pinned layer. The heating reduces the material component of the anisotropy and allow the shape anisotropy to dominate the magnetization directions. In this manner, once the orienting field is removed, the shape anisotropy directs the magnetization in the desired direction. Upon removing the orienting field, the magnetizations of the reference layers relax to follow the shape of the reference layers so as to induce a magnetization that is aligned along the desired axis of the shaped reference layer and later pinned when the pinning layer provides enough pinning field during the anneal process. For example, if two reference layers (pinned SAF) are shaped to have longer dimensions which are perpendicular to one another, then the induced magnetizations for the two reference layers will be close to being perpendicular to one another.

However, there are additional sources beyond the shape anisotropy that influence the magnetization of the reference layers and thus determine the final pinning direction. While the pinning steps take place at high temperature, thereby reducing the intrinsic anisotropy of the deposited ferromagnetic layers, a finite anisotropy is still present with a defined direction which competes with the shape anisotropy of the patterned reference layer. Also, due to field cycling over time, the support structure and/or pole pieces for the magnet oven utilized in the pinning anneal may become magnetized, applying a small residual field even in the absence of magnetizing current. This residual field will interact with the reference layer magnetization, and may be either zeroed out or overcome to create a small compensating field with a field that is applied in a direction to oppose this remnant field. Additionally, similar to the distribution of pinning strengths present in any real pinned ferromagnetic layer, there exists a local distribution in the temperature required to pin the ferromagnetic layer. This allows high temperature steps, that occur prior to the pinning anneal, to create a low level of local pinning sites that may influence the direction of the magnetization during the pinning anneal. Therefore competition between the intrinsic anisotropy, shape anisotropy, low level of early pinning, and a small remnant field present during the pinning anneal prevent a true orthogonal setting of the induced magnetizations. For accurate elimination of soft Fe effects in the final device, a true orthogonal setting is desired as any simple calibration for soft Fe effects will lose accuracy if non-orthogonalities are also present. This true orthogonal setting may be accomplished by one or more of: 1) Tailoring the intrinsic anisotropy of the reference layer material by applying a field direction during the deposition to induce an anisotropy direction that is different from that used during the setting procedure. A similar method to tailor the intrinsic anisotropy is to apply an alternating field during the deposition of the magnetic layers in order to remove the possibility of introducing a low level of magnetic pinning in the pinned layer during the high energy deposition of the ferromagnetic layers, which will counteract the desired pinning direction during the magnetic field anneal. A third tailoring possibility is to produce a rotating field during the deposition of the magnetic material to remove any preferred anisotropy direction. Additionally, the magnetic materials with low intrinsic anisotropy field can be used as pinned layer for improving true orthogonal setting. 2) Applying a small field during the pinning portion of the magnetic anneal to either eliminate the residual field in the magnet or to provide a slight negative net field for proper compensation of the intrinsic anisotropy. 3) Forming the reference layers with a non-orthogonal axis wherein the final resultant setting direction is truly orthogonal. When the reference layers with a non-orthogonal alignment are used, the offset of the response curve of signal vs. magnetic field direction can be reduced, however, the offset standard deviation cross the wafer is high. Therefore, there is a need to improve offset standard deviation cross wafer.

If the reference layers have not been annealed above the pinning temperature (which is the lower of either the antiferromagnetic blocking temperature or the antiferromagnetic crystalline phase formation temperature) of the antiferromagnet, then a single anneal process is applied to set the induced magnetizations for the two reference layers. With this approach, a single pinning material deposition step and a single anneal step are performed to set all induced magnetizations for the reference layers without requiring additional magnetic layers, thereby providing a bulk wafer setting procedure that simplifies and reduces the manufacturing cost and complexity, as compared to previously known methods utilizing either two different antiferromagnetic pinning layers or a magnetic array to set the pinning directions. The simplified process for forming reference layers with different pinned directions allows independent magnetic sensor elements to be formed at a minimal spacing within the sensor die, and as a result, different sensor configurations within a single die of minimal area can have different sensitive axes.

An illustrative embodiment of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to magnetic sensor design and operation, Magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent exemplary embodiments of the invention. It should be noted that many alternative or additional circuit/component layouts may be present in a practical embodiment.

FIG. 1 shows a magnetic field sensor 100 formed with first and second differential sensors 101, 111 for detecting the component directions of an applied field along a first axis 120 (e.g., the y-axis direction) and a second axis 110 (e.g., the x-axis direction), respectively. As depicted, each sensor 101, 111 is formed with unshielded sense elements that are connected in a bridge configuration. Thus, the first sensor 101 is formed from the connection of a plurality of sense elements 102-105 in a bridge configuration over a corresponding plurality of pinned layers 106-109, where each of the pinned layers 106-109 is magnetized in the y-axis direction. In similar fashion, the second sensor 111 is formed from the connection of a plurality of sense elements 112-115 in a bridge configuration over a corresponding plurality of pinned layers 116-119 that are each magnetized in the x-axis direction that is perpendicular to the magnetization direction of the pinned layers 106-109. In the depicted bridge configuration 101, the sense elements 102, 104 are formed to have a first easy axis magnetization direction and the sense elements 103, 105 are formed to have a second easy axis magnetization direction, where the first and second easy axis magnetization directions are orthogonal with respect to one another and are oriented to differ equally from the magnetization direction of the pinned layers 106-109. As for the second bridge configuration 111, the sense elements 112, 114 have a first easy axis magnetization direction that is orthogonal to the second easy axis magnetization direction for the sense elements 113, 115 so that the first and second easy axis magnetization directions are oriented to differ equally from the magnetization direction of the pinned layers 116-119. In the depicted sensors 101, 111, there is no shielding required for the sense elements, nor are any special reference elements required. In an exemplary embodiment, this is achieved by referencing each active sense element (e.g., 102, 104) with another active sense element (e.g., 103, 105) using shape anisotropy techniques to establish the easy magnetic axes of the referenced sense elements to be deflected from each other by 90 degrees. The configuration shown in FIG. 1 is not required to harvest the benefits of the dual axis pinning technique, and is only given as an example. For example, thin shields may also be used to suppress the sensor response of two of four identical sensor elements to achieve a differential response.

By positioning the first and second sensors 101, 111 to be orthogonally aligned, each with the sense element orientations deflected equally from the sensor's pinning direction and orthogonal to one another in each sensor, the sensors can detect the component directions of an applied field along the first and second axes.

As seen from the foregoing, a magnetic field sensor may be formed from differential sensors 101, 111 which use unshielded sense elements 102-105, 112-115 connected in a bridge configuration over respective pinned layers 106-109, 116-119 to detect the presence and direction of an applied magnetic field. With this configuration, the magnetic field sensor provides good sensitivity, and also provides the temperature compensating properties of a bridge configuration.

Figure 2:
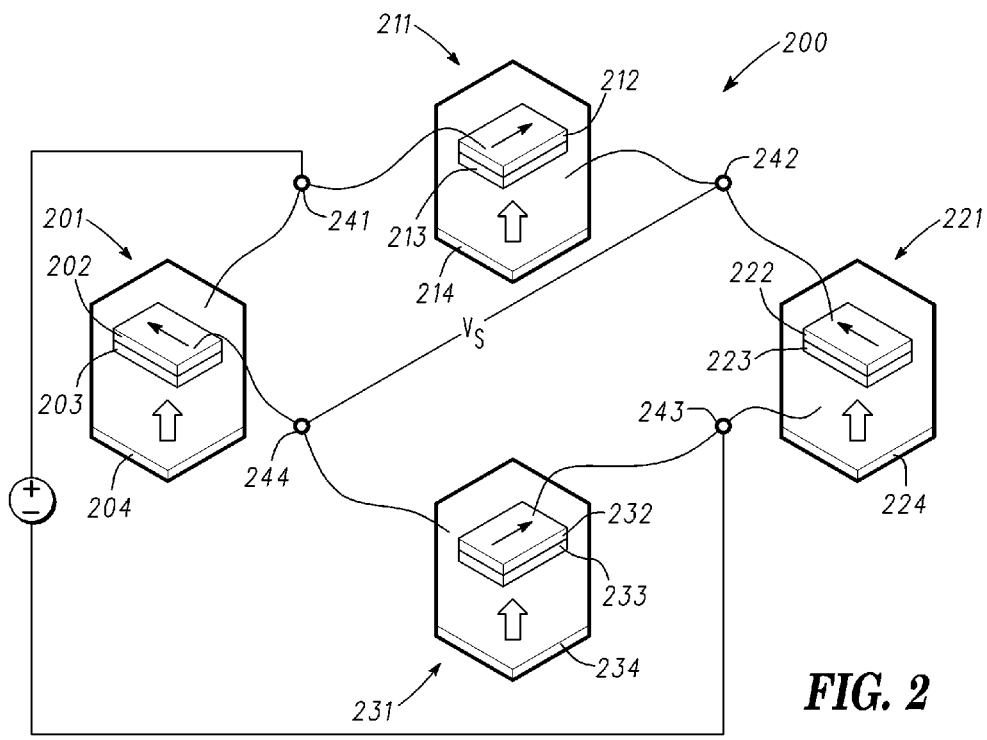
FIG. 2 is a simplified schematic perspective view of an exemplary field sensor formed by connecting four MTJ sensors in a Wheatstone bridge circuit.

To provide additional insight into the structure and formation of the magnetic field sensor of the exemplary embodiments, FIG. 2 provides a simplified schematic perspective view of an exemplary field sensor 200 formed by connecting four MTJ sense elements 201, 211, 221, 231 in a Wheatstone bridge circuit. The bridge circuit may be manufactured as part of an existing MRAM or thin-film sensor manufacturing process with only minor adjustments to control the magnetic orientation of the various sensor layers. In particular, the depicted MTJ sensors 201, 211, 221, 231 are formed with pinned layers 204, 214, 224, 234 that are each magnetically aligned in a single pinned direction, and with sense layers 202, 212, 222, 232 that are aligned to have different magnetization directions from the magnetization direction of the pinned layers 204, 214, 224, 234. As formed, each MTJ sensor (e.g., 201) includes a pinned electrode 204 formed within reference layers shown in FIGS. 3, 4 and subsequently discussed in more detail, an insulating tunneling dielectric layer 203, and a sense electrode 202 formed with one or more upper ferromagnetic layers. The pinned and sense electrodes are desirably magnetic materials whose magnetization direction can be aligned. Suitable electrode materials and arrangements of the materials into structures commonly used for electrodes of magnetoresistive random access memory (MRAM) devices and other MTJ sensor devices are well known in the art. For example, the pinned layers 204, 214, 224, 234 are formed with a layer of CoFe. In the following embodiments, these pinned layer may be formed with a layer of CoFe and a layer of CoFeB (FIG. 3), or two layers of CoFe separated by a layer of CoFeB (FIG. 4) to a combined thickness in the range 10 to 100 Å, and in selected embodiments in the range 10 to 40 Å.

In an exemplary implementation (FIG. 3), each of the pinned layers (e.g., 204, 214, 224, and 234) is formed with two ferromagnetic layers: an amorphous ferromagnetic layer such as CoFeB, and a crystalline ferromagnetic layer such CoFe, over an anti-ferromagnetic pinning layer. In another exemplary implementation (FIG. 4), each pinned layer (e.g., 204, 214, 224, 234) includes a ferromagnetic stack component (e.g., a stack of CoFe, CoFeB and CoFe) which is 20 to 80 Å thick. An underlying anti-ferromagnetic pinning layer is approximately 200 Å thick. The lower anti-ferromagnetic pinning materials may be PtMn, though other materials, such as PtPdMn, IrMn and RhMn, may be used. As formed, the pinned layers function as a fixed or pinned magnetic layer when the direction of its magnetization is pinned in one direction that does not change during normal operating conditions. As disclosed herein, the heating qualities of the materials used to pin the pinned layers 204, 214, 224, 234 can change the fabrication sequence used to form these layers.

Figure 3:
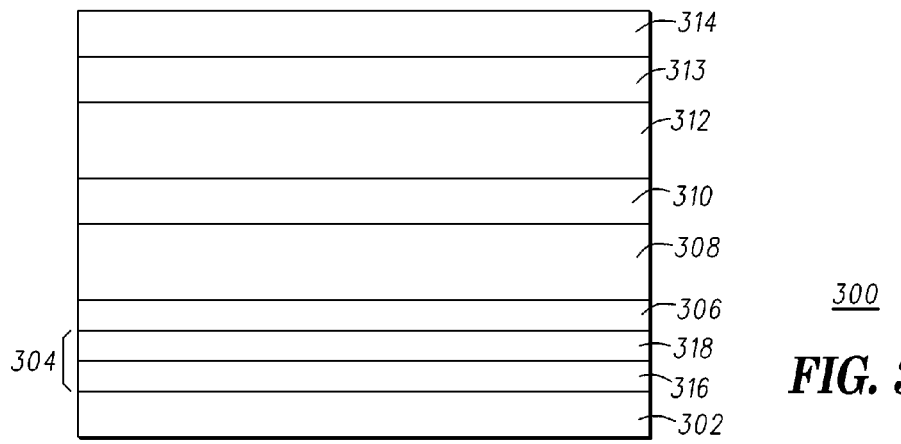
FIG. 3 is a cross section of a sensor layer stack in accordance with an exemplary embodiment.

More specifically and by way of example, referring to FIG. 3, the structure 300 includes a pinned layer 304 formed between a pinning layer 302 comprising PtMn and a coupling layer 306 comprising Ruthenium (Ru). A fixed layer 308 is formed over the coupling layer 306 and a tunnel barrier 310 comprising AlOx is formed between the fixed layer 308 and a free layer 312 comprising NiFe. A cap layer 314 may be formed over the free layer 312. Optionally, a diffusion barrier 313 comprising AlOx may be formed over the free layer 312 prior to formation of the cap layer 314. The pinned layer 304 includes an amorphous ferromagnetic layer 316, preferably of CoFeB where B is 15.0 to 30.0% by atomic weight, formed between a crystalline ferromagnetic layer 318 of CoFe (where Fe comprises 10.0-25.0 by atomic weight) and the pinning layer 302. The amorphous ferromagnetic layer 316 of CoFeB has a thickness from 2 to 15 Å. Typically, CoFeB alloys have softer magnetic properties compared with CoFe alloys, so CoFeB/CoFe pinned layers provide a better soft magnetic properties. The soft magnetic CoFeB/CoFe pinned layer leads to less non-orthogonal aligned references layers for true orthogonal pinning directions and zero offset, and more significantly reduced offset deviation cross wafer, which strongly impact the manufacturability of these magnetic sensors By way of another example and referring to FIG. 4, the structure 400 includes the pinning layer 302, coupling layer 306, fixed layer 308, tunnel barrier 310, free layer 312, and cap layer 314 as in the structure 300 of FIG. 3. However, the pinned layer 404 formed between the pinning layer 302 and the coupling layer 306 in FIG. 4 includes an amorphous ferromagnetic layer 416, preferably of CoFeB where B is 15.0 to 30.0% by atomic weight, formed between a first crystalline ferromagnetic layer 420 of, for example, CoFe and a second crystalline ferromagnetic layer 418 of, for example, CoFe, where the Fe of both layers 418, 420 comprises 10.0-25.0 by atomic weight. The amorphous ferromagnetic layer 416 has a thickness in the range of 2 to 15 Å, while the crystalline ferromagnetic layer 420 has a thickness in the range of 2 to 10 Å. Similar to the pinned layer shown in FIG. 3, the magnetic layer formed with a CoFeB layer inserted in a CoFe layer provides softer magnetic pinned layer. Furthermore, this magnetically pinned structure also has strong exchange coupling with pinning layer such as PtMn, hence high pinning field. This soft magnetic pinned structure leads to 40% reduction of offset deviation cross wafer.

Figure 4:
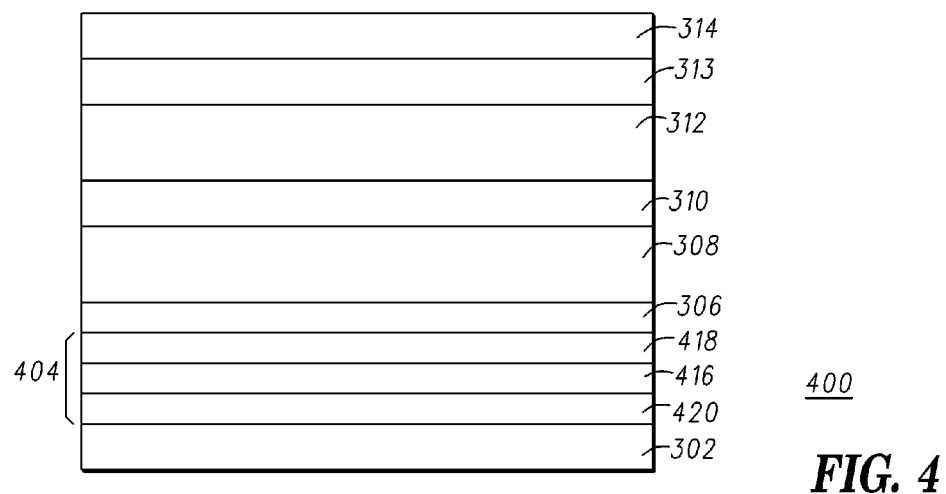
FIG. 4 is a cross section of a sensor layer stack in accordance with another exemplary embodiment.
Figure 5:
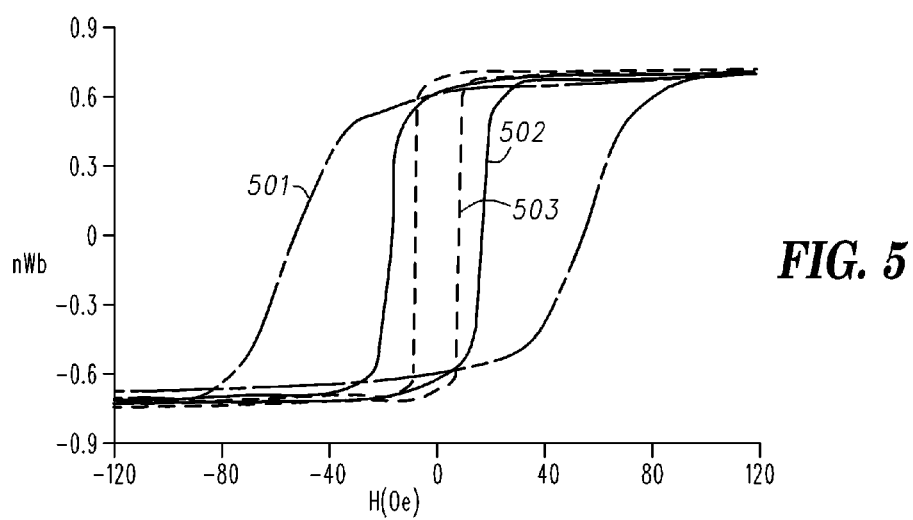
FIG. 5 is a graph of pre-annealed M-H loops having different thicknesses of CoFeB and CoFe.

FIG. 5 shows pre-annealed M-H loops of CoFeB/CoFe pinned layer structures with different CoFeB thickness. The sample 501 has a CoFe thickness of 22.7 Å while the samples 502 and 503 have the CoFeB/CoFe thickness (in Å) of 10/14.4 and 15/10.8, respectively. The coercive field of the CoFeB/CoFe layer is significantly reduced with increasing CoFeB thickness up to 15 Å, indicating improved soft magnetic properties. Furthermore, the width of switching is also reduced with a thick CoFeB layer, indicating less dispersion of magnetization directions. The squareness of hysteresis loops are also improved with a CoFeB layer. The pinned structure shown in FIG. 4 has the similar soft magnetic properties as shown in FIG. 5, i.e., reduced coercive field and switching width. Additionally, the hard-axis M-H loops shows small coercivity and small anisotropy field as increasing CoFeB layer thickness for pinned layer structure as shown in FIGS. 3 and 4.

Figure 6:
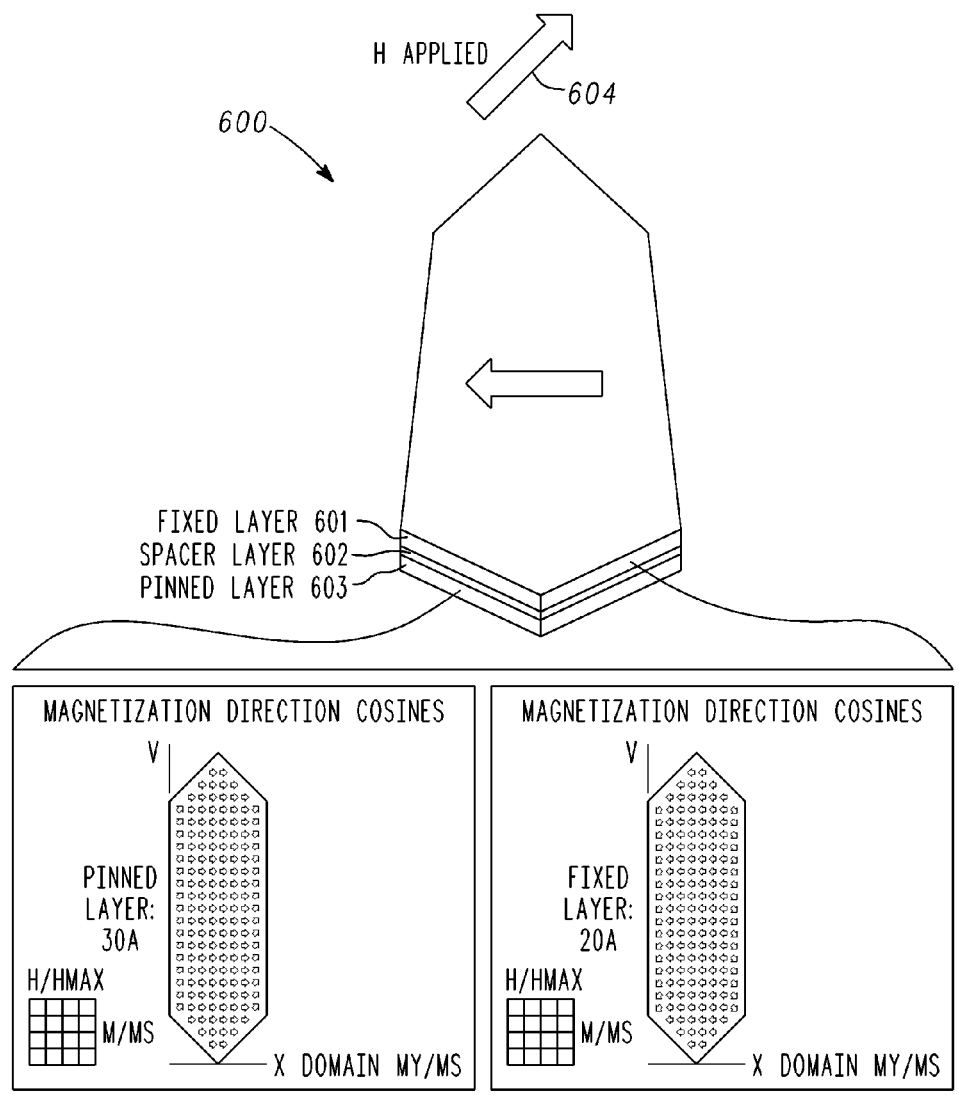
FIG. 6 depicts an imbalanced SAF stack used to form a pinned reference layer.

The pinned reference layer (e.g., 204, 214, 224, 234) may be formed having a magnetization direction (indicated by the arrow) that aligns along the long-axis of the patterned reference layer(s). However, in other embodiments, the pinned reference layer may be implemented with a synthetic anti-ferromagnetic (SAF) layer which is used to align the magnetization of the pinned reference layer along the short axis of the patterned reference layer(s). As will be appreciated, the SAF layer may be implemented in combination with an underlying anti-ferromagnetic pinning layer, though with SAF structures with appropriate geometry and materials that provide sufficiently strong magnetization, the underlying anti-ferromagnetic pinning layer may not be required, thereby providing a simpler fabrication process with cost savings. For example, FIG. 6 depicts a pinned reference layer 600 formed from an imbalanced synthetic anti-ferromagnet (SAF) having two differing ferromagnet layers 601, 603 separated by a Ruthenium spacer layer 602, where the ferromagnetic layers above 601 and below 603 the ruthenium layer 602 have different magnetic moments. Either or both of the ferromagnetic layers may be formed with CoFe (Cobalt Iron) or any desired ferromagnetic alloy. For example, CoFe may be used for the lower layer and CoFeB may be used for the upper layer in an exemplary embodiment. At certain periodic thicknesses of the Ruthenium spacer layer 602, the two ferromagnet layers 601, 603 will be exchange coupled so that the anti-parallel state is the low energy state. As a result, the net magnetic moment is minimized and the immunity to external field response is strengthened. An exemplary implementation and micromagnetic simulation of an imbalanced SAF stack 600 is shown in FIG. 6, where the imbalanced SAF 600 includes a fixed layer 601 formed with CoFeB to a thickness of approximately 20 Angstroms, a spacer layer 602 formed with Ruthenium to a thickness of approximately 10 Angstroms, and a pinned layer 603 formed with CoFeB to a thickness of approximately 30 Angstroms. With this exemplary SAF structure, a net moment is created which will respond to the externally applied magnetic field H 604 as shown in FIG. 6. For a reference layer formed with a SAF that has micron scale dimensions (e.g., greater than approximately 2 um along the short axis), the magnetization tends to align anti-parallel along the short axis instead of along the long axis, hence the short axis sets the pinning direction. This results from the fact that the lowest energy state is for the two layers to close their magnetic flux along the short axis of the patterned shape. In remanence (e.g., after the setting field is removed), the magnetic moment of the largest moment layer (e.g., the lower pinned layer 603 in this example) aligns so that it is along the short axis of the SAF in the direction that has a positive projection onto the setting field angle (to the right in this example). Conversely, the magnetic moment of the smaller moment layer (e.g., the upper fixed or reference layer 601 in this example) aligns in the opposite direction from the pinned layer 603, as shown in FIG. 6.

Referring again to FIG. 2, the upper or sense layers 202, 212, 222, 232, may be formed with one or more layers of ferromagnetic materials to a thickness in the range 10 to 5000 Å, and in selected embodiments in the range 10 to 60 Å. The upper ferromagnetic materials may be magnetically soft materials, such as NiFe, CoFeB, NiFeX, CoFeX (X is non magnetic element) and the like. In each MTJ sensor, the upper ferromagnetic layers 202, 212, 222, 232 function as a sense layer or free magnetic layer because the direction of their magnetization can be deflected by the presence of an external applied field, such as the Earth's magnetic field. As finally formed, the upper or sense layers 202, 212, 222, 232 may be formed with a single ferromagnetic layer having a magnetization direction (indicated with the arrows) that aligns along the long-axis of the patterned shapes 202, 212, 222, and 232.

The pinned and sense electrodes may be formed to have different magnetic properties. For example, the pinned electrodes 204, 214, 224, 234 may be formed with an anti-ferromagnetic film exchange layer coupled to a ferromagnetic film to form layers with a high coercive force and offset hysteresis curves so that their magnetization direction will be pinned in one direction, and hence substantially unaffected by an externally applied magnetic field. The ferromagnetic film can be a single magnetic layer or SAF layers where two ferromagnetic layers anti-ferromagnetically coupled through a coupling layer. In contrast, the sense electrodes 202, 212, 222, 232 may be formed with a magnetically soft material to provide different magnetization directions having a comparatively low anisotropy and coercive force so that the magnetization direction of the sense electrode may be altered easily by an externally applied magnetic field. In selected embodiments, the strength of the pinning field is about two orders of magnitude larger than the anisotropy field of the sense electrodes, although different ratios may be used by adjusting the respective magnetic properties of the electrodes using well known techniques to vary their composition.

As shown in FIG. 2, the pinned layers 204, 214, 224, 234 in the MTJ sensors are formed to have a first exemplary magnetization direction in the plane of the pinned layers 204, 214, 224, 234 (identified by the vector arrows pointing toward the top of the drawing of FIG. 2). As described herein, the magnetization direction for the pinned layers 204, 214, 224, 234 may be obtained using shape anisotropy of the pinned electrodes, in which case the shapes of the pinned layers 204, 214, 224, 234 may each be longer in the direction of the "up" vector arrow. In particular, the magnetization direction for the pinned layers 204, 214, 224, 234 may be obtained by first heating the shaped pinned layers 204, 214, 224, 234 in the presence of a orienting magnetic field which is oriented non-orthogonally to the axis of longest orientation for the shaped pinned layers 204, 214, 224, 234 such that the applied orienting field includes a field component in the direction of the desired pinning direction for the pinned layers 204, 214, 224, 234. The magnetization directions of the reference layers are aligned, at least temporarily, in a predetermined direction. However, by appropriately heating the pinned layers during this treatment and removing the orienting field without reducing the heat, the magnetization of the reference layers relaxes along the desired axis of orientation for the shaped pinned layers 204, 214, 224, 234. Once the magnetization relaxes, the reference layers can be annealed and/or cooled so that the magnetization direction of the pinned layers is set in the desired direction for the shaped pinned layers 204, 214, 224, 234. A true orthogonal setting may be accomplished by forming the reference layers with a non-orthogonal axis wherein the final induced magnetizations are truly orthogonal. With this approach, the formation of the magnetization direction for the pinned layers 204, 214, 224, 234 can readily be reconciled with the fabrication steps used to form other pinning electrodes having distinct magnetization direction(s).

Figure 7:
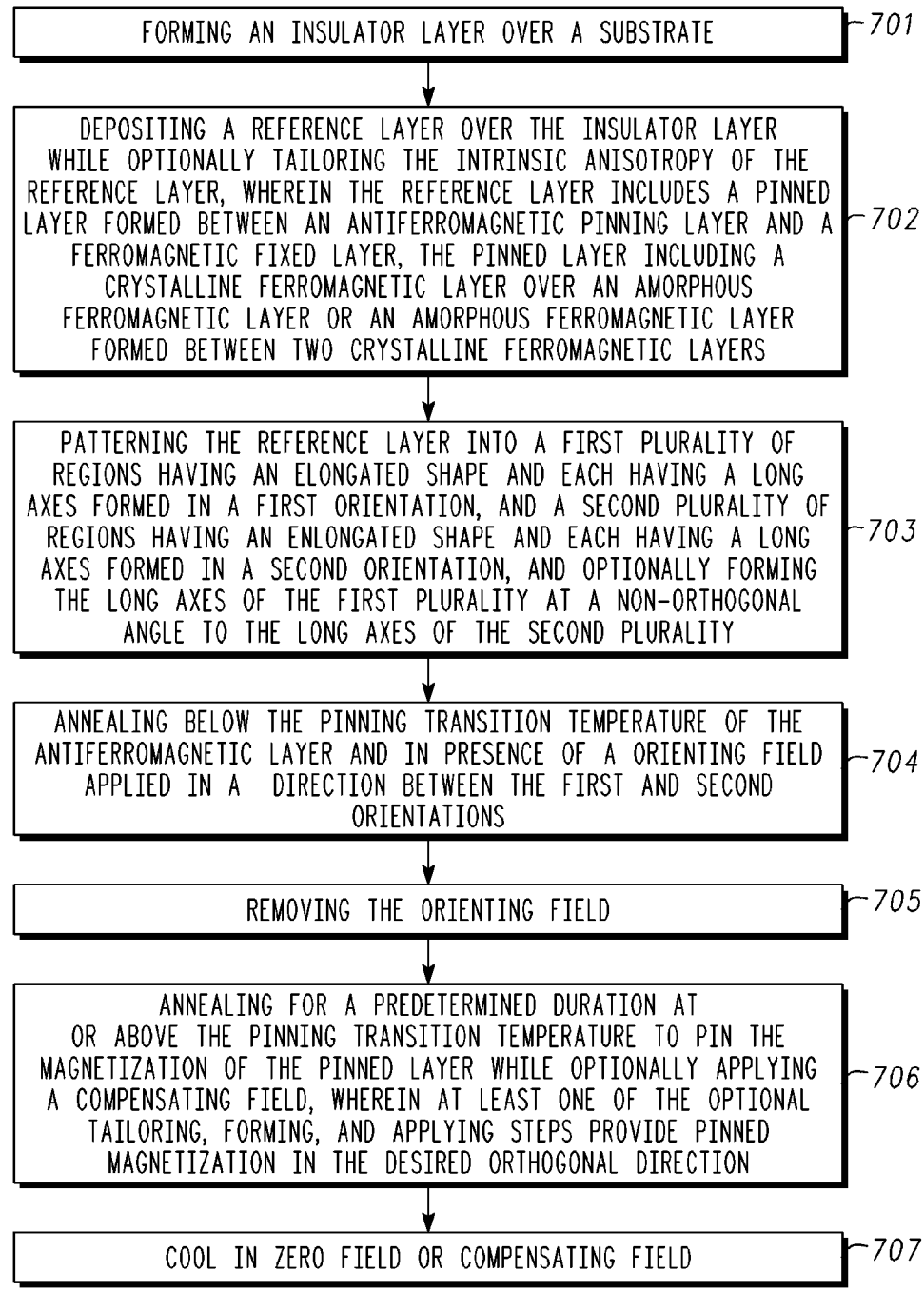
FIG. 7 is a flowchart of an exemplary method of fabricating a ferromagnetic thin-film based magnetic field sensor.

FIG. 7 is a flow chart that illustrates an exemplary method 700 of fabricating MTJ field sensors which have orthogonal reference layers using a bulk wafer setting procedure to form shaped reference electrodes including two or more pinned layers for providing a reduced compensation angle for a zero offset. It should be appreciated that the method 700 may include any number of additional or alternative tasks, the tasks shown in FIG. 7 need not be performed in the illustrated order, and method 700 may be incorporated into a more comprehensive procedure or process having additional functionality not described in detail herein. Moreover, one or more of the tasks shown in FIG. 7 could be omitted from an embodiment of the method 700 as long as the intended overall functionality remains intact. At step 701 a substrate structure is provided using known semiconductor processing techniques. As will be appreciated, the substrate structure includes a substrate that is covered by a base insulator layer, where one or more active circuit elements, such as digital or analog integrated circuits, may be formed on or in the substrate. The substrate and active circuit(s) may be formed as part of a front-end semiconductor fabrication process.

Next at step 702, the MTJ layers are formed by depositing the sensor layers 201, 211, 221, 231 over the base insulator layer using a multi-step fabrication process. At this point, the sensor layers may be formed as part of a back-end magnetics fabrication process which occurs after the front-end semiconductor fabrication process. At step 702, the first of the sensor layers is formed by depositing the reference layers over the insulating layer, wherein the reference layers include a pinned layer formed between an antiferromagnetic pinning layer and a ferromagnetic fixed layer. The pinned layer includes a crystalline ferromagnetic layer over an amorphous ferromagnetic layer, or an amorphous ferromagnetic layer formed between two crystalline ferromagnetic layers. Though not shown, the pinning layer may be deposited in electrical contact with an underlying conductive contact layer. The materials chosen to form the pinning layer and the pinned layer should be such that the resultant ferromagnetic layer will have a relatively high pinning strength, and should be sufficiently refractory so as to withstand annealing temperatures (e.g., 200 to 350 degrees Celsius) if used to pin the magnetization direction of the pinned layer in a predetermined orientation. Additional sensor layers, such as the tunneling dielectric layer(s) 203, 213, 223, 233 and the sense electrode layer(s) 202, 212, 222, 232, may also be deposited at this time using well known techniques. The intrinsic anisotropy (atomic-level pair ordering) of the reference layer 204, 214, 224, 234, in accordance with the first embodiment, may be tailored during deposition in order to obtain a true orthogonal directional difference between the pinned magnetizations. For the low level of compensation required, the direction of the pair-ordering anisotropy is set by an applied magnetic field during deposition. Methods of inducing a stronger anisotropy than by shape and intrinsic include growing a magnetic material with a preferred crystalline orientation and inducing by certain anisotropic film growth methods (for example, from shape asymmetry of the growing clusters or crystallites).

Figure 8:
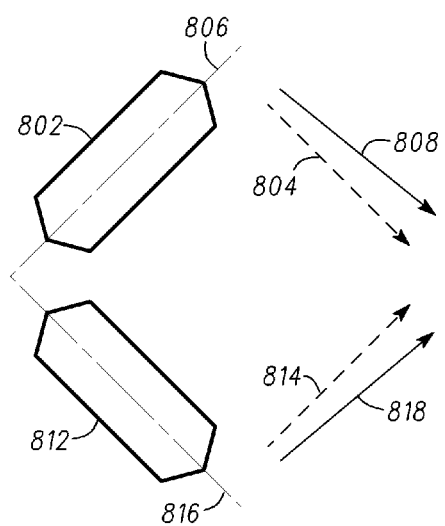
FIG. 8 is a top schematic view of two reference layers formed from imbalanced synthetic anti-ferromagnets (SAFs) and their actual and desired magnetizations.
Figure 9:
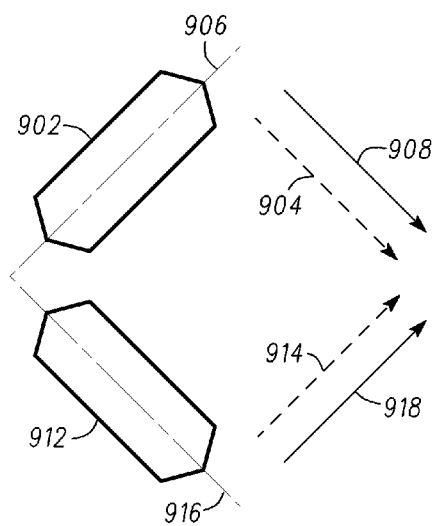
FIG. 9 is a top schematic view of the two reference layers of FIG. 5 but rotated in accordance with an exemplary embodiment.

At step 703, the deposited reference layer(s) are also patterned and selectively etched into elongated shapes having long axes drawn with different orientations. As a result of the etching, each shaped reference layer has a preferred shape anisotropy direction in the direction of the desired pinned magnetization direction. However, due to intrinsic anisotropy, SAF coupling strength and remenent field during anneal, the actual pinning direction may be different from that desired. For example, FIG. 8 shows a first reference layer 802 having a desired pinning (direction 804) orthogonal to the long axis 806. However, an actual pinning (direction 808) is different from the desired pinning (direction 804). A second reference layer 812 has a desired pinning (direction 814) orthogonal to the long axis 816. However, an actual pinning (direction 818) is different from the desired pinning (direction 814). In order to obtain a true orthogonal angle of the actual pinned magnetizations, a determination may be made from empirical pre-obtained results of the pinned magnetizations in relation to the long axes allowing for a positioning of the patterned elongated shapes in a direction to one another to provide the true orthogonal angle. The patterning (step 703) of the reference layers 902, 912 shown in FIG. 9 may be adjusted by modifying the angle between the long axes 906, 916 that results in the actual pinning (directions 908, 918) being orthogonal as desired (directions 904, 914).

At step 704, the etched reference layers, for materials such as PtMn which undergo a phase transition as the temperature crosses its transformation temperature, are heated or annealed below the pinning transition temperature in the presence of a orienting field that is applied with a direction that is between the different desired pinned magnetization directions for the different reference layers. For example, if two orthogonally oriented pinned layers are being formed, the applied orienting field may be oriented half-way between the desired orientations of the orthogonal pinned layers. Stated more generally, the applied orienting field should be oriented so that it includes a field component in the direction of each of the desired pinning directions for the reference layers. The properties of the materials used to form the reference layer will control how heat is to be applied. The heat step should be controlled so that the magnetizations of the shaped reference layers are free to follow the external magnetic field.

Figure 10:
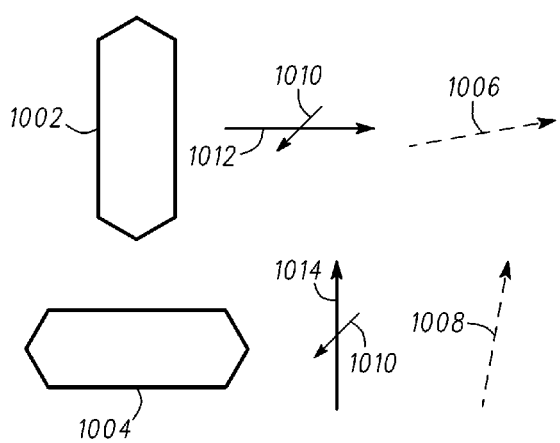
FIG. 10 is a top schematic view of two reference layers formed from imbalanced SAFs and their actual magnetizations with a compensating field applied in accordance with an exemplary embodiment.

At step 705, the orienting magnetic field is removed, and at step 706, an anneal temperature at or above the pinning transition temperature is maintained for a predetermined duration, e.g., two hours. In the absence of an applied field, the high aspect ratio patterns provide a shape anisotropy that forces the applied magnetization in the shaped reference layers to relax along the respective anisotropy axes of the shaped reference layers. During anneal, the pinning layer such as PtMn, PtPdMn after phase transformation provides exchange coupling with the pinned layer. For other pinning layers such as IrMn, RhMn (which do not require phase transformation for exchange coupling), the anneal temperature has to be higher than the block temperature of the pinning layer in order to have the shaped reference layer pinned at desired directions. The direction of this applied magnetization may be fine tuned (so as to provide truly orthogonal magnetization directions) by applying a compensating field. FIG. 10 illustrates first and second reference layers 1002, 1004, each having a relaxation preference (directions) 1006, 1008 respectively. The application of a compensating field 1010 overcomes the influence provided by the combination of intrinsic anisotropy and magnet residual field resulting in the actual pinning 1012, 1014 directed in the desired directions and orthogonal to one another.

At step 707, the wafer is then cooled in zero, or compensating field so that the shape-induced magnetizations in the reference layers are pinned, thereby providing multiple orientations of reference layers. By cooling the reference layers below the blocking temperature after the shape-induced magnetizations are obtained in the zero or small compensating field, the magnetizations of the reference layers become pinned, and will remain rigidly pinned in their respective directions, at least for typical applied field strengths.

Using the techniques disclosed herein, first and second differential sensors (e.g., sensors 101, 111 shown in FIG. 1) may be fabricated together on a monolithic integrated circuit by forming the first reference layers 106-109 with a first pinning direction and simultaneously forming the second reference layers 116-119 with a second pinning direction that is orthogonal to the first pinning direction. These techniques may be further illustrated with a description of an exemplary process flow, beginning with FIG. 11 which depicts a partial cross-sectional view of a multi-sensor structure in which a stack of MTJ sensor layers 1160, 1170, 1180 have been formed over a substrate 1140 and base insulator layer 1150. When the sensors are to be integrated with semiconductor circuitry, conductive vias through the insulator layer 1150, made by methods known by those skilled in the art, will connect conductive portions of the sensors to the underlying circuitry in the substrate 1140. Depending on the type of transistor device being fabricated, the substrate 1140 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 1140 may be implemented as the top semiconductor layer of a semiconductor-on-insulator (SOI) structure. Though not shown, one or more circuit elements may be formed on or in the substrate 1140. In addition, a base insulator layer 1150 is formed by depositing or growing a dielectric (e.g., silicon dioxide, oxynitride, metal-oxide, nitride, etc.) over the semiconductor substrate 1140 using chemical vapor deposition (CVD), plasma-enhanced chemical vapor deposition (PECVD), physical vapor deposition (PVD), atomic layer deposition (ALD), ion beam deposition (IBD), thermal oxidation, or combinations of the above.

Over the base insulator layer 1150, the stack of sensor layers is sequentially formed by depositing a first conductive layer (not shown) to serve after etching as a conductive line, lower ferromagnetic layers 1160 (to serve after etching as the lower reference ferromagnetic layer), one or more dielectric layers 1170 (to serve after etching as the tunnel barrier layer), one or more upper ferromagnetic layers 1180 (to serve after etching as the upper sense ferromagnetic layer), and a second conductive layer (not shown) to serve after etching as the conductive line. Each of the layers may be blanket deposited using known techniques, such as CVD, PECVD, PVD, ALD, IBD, or combinations thereof to a predetermined thickness. In this way, the stack of sensor layers covers the entire wafer so that the stack is formed in the "Sensor 1" area where a first type of sensor (e.g., x-axis sensors) will be formed, and is also formed in the "Sensor 2" area where a second type of sensor (e.g., y-axis sensors) will be formed. In addition, the sensor stack may be formed in "Other" areas where a sensor having any desired orientation will be formed.

Figure 11:
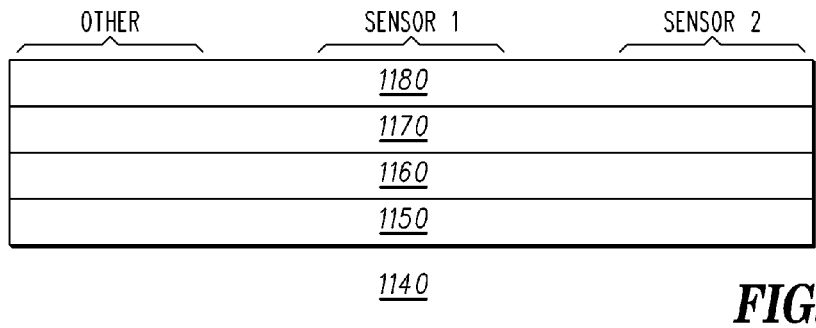
FIG. 11 is a partial cross-sectional view of an integrated circuit in which a stack of MTJ sensor layers have been formed over a substrate.
Figure 12:
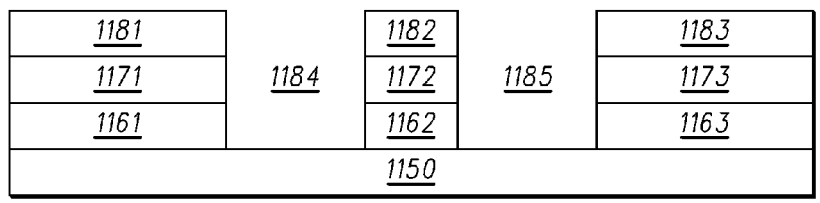
FIG. 12 illustrates processing subsequent to FIG. 11 after the stack of MTJ sensor layers have been selectively etched into predetermined shapes over the substrate.
Figure 13:
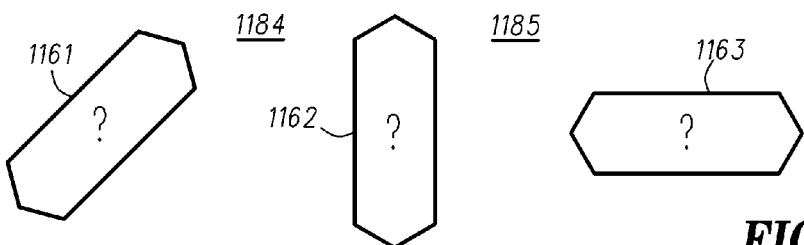
FIG. 13 illustrates a top view to show the predetermined shapes of the reference layers in the stack of MTJ sensor layers formed by the selective etch process.

FIG. 12 illustrates processing of the sensor device structures subsequent to FIG. 11 after the stack of MTJ sensor layers 1160, 1170, 1180 have been selectively etched, thereby defining predetermined shapes for the remnant sensor layers over the substrate 1140 in each of the sensor areas. Any desired pattern and etching processes may be used to form the patterned sensor layers, including depositing a hardmask layer, such as silicon nitride (not shown), over the upper ferromagnetic layer(s) 1180, depositing and patterning a photoresist layer (not shown) to pattern the hardmask layer, and then selectively etching (e.g., with a reactive ion etching process) the exposed sensor layers using a photoresist layer (not shown) to form the openings 1184, 1185. To more clearly see how the selective etch process creates different predetermined shapes from the stack of MTJ sensor layers, reference is made to FIG. 13, which provides a simplified top view of the sensor device structures depicted in FIG. 12. As depicted in FIGS. 12 and 13, the openings 1184, 1185 in the sensor layer stack 1160, 1170, 1180 define the sensor layers 1162, 1172, 1182 in the first sensor area to have a first shape that is oriented to have an easy axis in the desired pinning direction for the finally formed reference layer 1162. In similar fashion, the openings 1184, 1185 define the shape of the sensor layers 1163, 1173, 1183 in the second sensor area so that they have an easy axis in the desired pinning direction for the finally formed reference layer 1163. While the openings 1184, 1185 can be used to define orthogonally oriented shapes 1162, 1163, any desired orientation can be achieved by properly patterning and controlling the etch process. For example, sensor layers 1161, 1171, 1181 in the "other" sensor area may be defined to have another shape that is oriented to have an easy axis in the desired pinning direction for the finally formed reference layer 1161. In addition to being formed as long and narrow shapes, additional shaping may be provided so that each of the pinned reference layers performs more like a single magnetic domain. In FIG. 13, the additional shaping is shown in the reference layers 1161, 1162, 1163, which are shaped to have pointed ends that taper. The magnetization directions (shown as a question mark) for various shaped reference layers 1161, 1162 and 1163 are unknown prior to the presentence of an orienting field.

Figure 14:
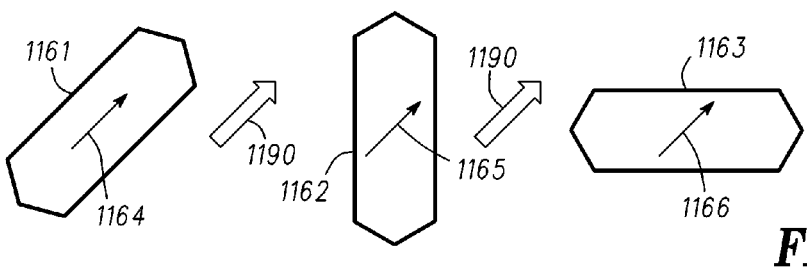
FIG. 14 illustrates processing subsequent to FIG. 13 when the etched reference layers are heated in the presence of an orienting field that is aligned between the desired magnetization directions for the finally formed reference layers.

Once the shaped reference layers 1161, 1162, 1163 are formed, the desired pinning direction for the reference layers may be induced by first heating or annealing the wafer in the presence of a orienting field that is oriented between the orientations of the reference layers 1161, 1162, 1163, and then removing the field while maintaining a high anneal temperature. The result of heating and orienting the reference layers is shown in FIG. 14, which illustrates processing of the sensor device structures subsequent to FIG. 10 when the etched reference layers 1161, 1162, 1163 are heated in the presence of orienting field. As shown in FIG. 14, the orienting field is aligned in a direction 1190 that is between the desired magnetization directions for the finally-formed reference layers. However, at this stage in the process, the magnetizations of the reference layers 1161, 1162, 1163 (as shown with the magnetization vectors 1164, 1165, 1166, respectively), follow the external magnetic field 1190 when the field is high enough.

Figure 15:
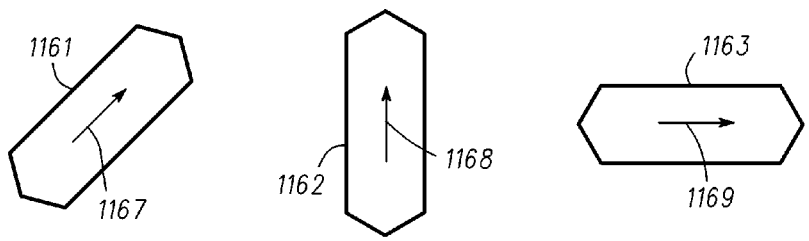
FIG. 15 illustrates processing subsequent to FIG. 14 after the orienting field is removed and the etched stack of MTJ sensors are cooled, thereby causing the magnetization of the etched reference layer to be pinned along the long axis.

FIG. 15 illustrates the magnetization orientations of the reference layers in the sensor device structures subsequent to FIG. 14 after the orienting field 1190 is removed and the etched stack of MTJ sensor layers are cooled. By cooling the wafer in a zero or small compensating field, the respective shapes of the reference layers 1161, 1162, 1163 provide shape anisotropy that causes the magnetization of each reference layer to relax along a desired direction. Thus, the magnetization 1168 of first reference layer 1162 follows its shape so that it is aligned with the desired dimension of the shaped reference layer 1162 (e.g., in the y-axis direction), thereby forming the desired pinning direction for the finally-formed reference layer 1162. In similar fashion, the desired pinning direction for the finally-formed reference layer 1163 is induced when the magnetization 1169 of second reference layer 1163 follows its shape anisotropy (e.g., in the x-axis direction). Of course, any desired pinning direction can be induced by properly shaping the reference layer, as shown with the reference layer 1161 where the magnetization 1167 follows the shape anisotropy of reference layer 1161 (e.g., at 45 degrees from the y-axis).

Figure 16:
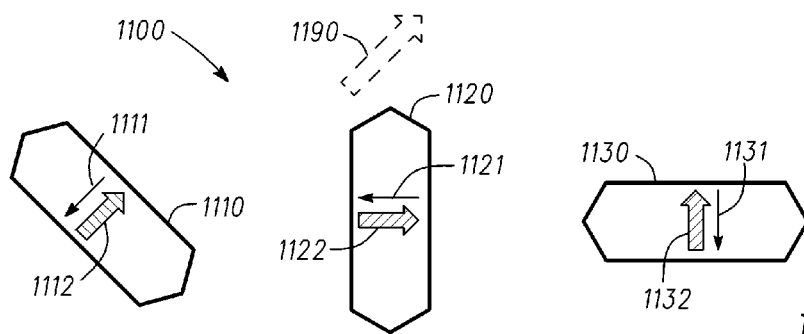
FIG. 16 illustrates processing of the pinned and reference layers formed with imbalanced SAF stacks after the orienting field is removed and the etched stack of MTJ sensors are cooled, thereby causing the magnetization of the etched reference layers to be pinned along the short axis.

FIG. 16 illustrates processing of pinned and reference layers 1100 that are formed by etching imbalanced SAF stacks 1110, 1120, 1130, annealing the layers 1100 at low temperature in the presence of a orienting field that is oriented between the short-axis orientations of the reference layers, and then removing the orienting field 1190 (as indicated with the dashed line field arrow), further annealing at the high temperature for PtMn providing pinning field, and the cooling the etched stack of MTJ sensors, thereby causing the magnetization of the etched reference layers 1110, 1120, 1130 to be pinned along their respective short axes. As illustrated, the magnetization orientations of the etched reference layers 1110, 1120, 1130 are pinned along the short axis of the etched reference layers. Thus, in the imbalanced SAF stack 1110, the reference layer magnetization 1111 and pinned layer magnetization 1112 are substantially anti-parallel to each other and orthogonal to the long axis of the etched reference layer 1110. Similarly, the reference layer magnetization 1121 and pinned layer magnetization 1122 in the imbalanced SAF stack 1120 are substantially anti-parallel to each other and orthogonal to the long axis of the etched reference layer 1120, and likewise for the etched reference layer 1130. With the imbalanced SAF stack embodiment depicted in FIG. 16, the long axis of reference layer 1110 is patterned orthogonal to the direction used for a single reference layer 1161 shown in FIG. 13 in order to provide a final reference direction that is midway between the orthogonal directions of reference layers 1120 and 1130.

Figure 17:
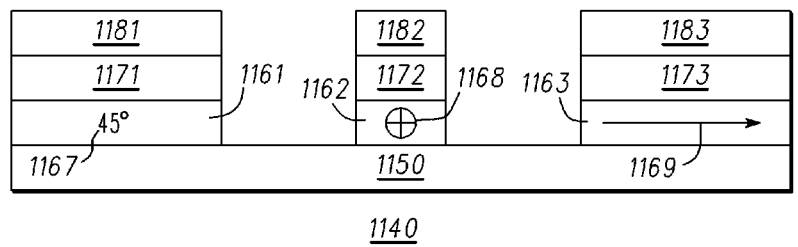
FIG. 17 is a partial cross-sectional view of the stack of MTJ sensor layers showing the pinned magnetization directions in the finally-formed reference layers.

To further illustrate the resulting formation of multiple orientations in different, finally-formed reference layers, reference is now made to FIG. 17 which provides a cross-sectional view of the etched stack of MTJ sensor layers depicted in FIG. 15. As depicted in FIGS. 15 and 17, the etched sensor layer stack 1162, 1172, 1182 in the first sensor area has a reference layer that is pinned in a first pinning direction (e.g., "into" the plane of the drawing in FIG. 17), the etched sensor layer stack 1163, 1173, 1183 in the second sensor area has a reference layer that is pinned in a second pinning direction (e.g., to the "right" in the plane of the drawing in FIG. 17), and the etched sensor layer stack 1161, 1171, 1181 in the other sensor area has a reference layer that is pinned in yet another pinning direction (e.g., at 45 degrees from the plane of the drawing in FIG. 17).

At this point in the fabrication process, each of the upper ferromagnetic or layer(s) 1181, 1182, 1183 (and the tunnel barrier layer(s)) will have been selectively etched into the same shape as the underlying reference layer. However, where the final shape of the sense layers will be smaller than the underlying pinned layers, a second etch sequence may be used to define the final shapes of the different sense layers from the remnant portions of the upper ferromagnetic layer(s) 1181, 1182, 1183. The second etch sequence defines high aspect ratio shapes for the sense layers by using a patterned mask and etch process (e.g., reactive ion etching) to remove all unmasked layers down to and including the unmasked upper ferromagnetic layer(s), but leaving intact the underlying shaped pinning layers. The defined high aspect ratio shapes for the sense layers are oriented so that each sense layer has a shape anisotropy axis. In other words, the long axis for each sense layer is drawn to create the desired easy axis magnetization direction.

Briefly, a current becomes spin-polarized after the electrons pass through the first magnetic layer in a magnet/non-magnet/magnet trilayer structure, where the first magnetic layer is substantially fixed in its magnetic orientation by any one of a number of methods known in the art. When the spin-polarized electrons tunnel through the insulator layer, the probability of the electron tunneling depends on the relative orientation of the free layer and the fixed layer. When a magnetic field is applied to field sensitivity axis for the sensor shown in FIGS. 1 and 2, the free layer rotates toward along the magnetic field direction, the relative orientation of fixed and free layers is changed, and therefore the MTJ resistance is changed. When these sensors are biased, an output signal can be detected.

During fabrication of the MTJ array architecture 400, each succeeding layer is deposited or otherwise formed in sequence and each MTJ device 400 may be defined by selective deposition, photolithography processing, etching, etc. using any of the techniques known in the semiconductor industry. Typically the layers of the MTJ are formed by thin-film deposition techniques such as physical vapor deposition, including magnetron sputtering and ion beam deposition, or thermal evaporation. During deposition of at least a portion of the MTJ, a magnetic field is provided to set a preferred anisotropy easy-axis into the material (induced intrinsic anisotropy). In addition, the MTJ stack is typically annealed at elevated temperature while exposed to a magnetic field directed along the preferred anisotropy easy-axis to further set the intrinsic anisotropy direction and to set the pinning direction when an antiferromagnetic pinning layer is used. The provided magnetic field creates a preferred anisotropy easy-axis for a magnetic moment vector in the ferromagnetic materials. In addition to intrinsic anisotropy, memory elements patterned into a shape having aspect ratio greater than one will have a shape anisotropy, and the combination of this shape and the intrinsic anisotropy define an easy axis that is preferably parallel to a long axis of the memory element.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photo resist material is applied onto a layer overlying a wafer substrate. A photo mask (containing clear and opaque areas) is used to selectively expose this photo resist material by a form of radiation, such as ultraviolet light, electrons, or x-rays. Either the photo resist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photo resist as a template.

Although the described exemplary embodiments disclosed herein are directed to various sensor structures and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Also the sense layers and the pinning layers may be formed with different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A magnetoresistive thin-film magnetic field sensor, comprising:
   an antiferromagnetic pinning layer;
   a pinned layer comprising:
      an amorphous ferromagnetic layer having a thickness in the range of 2 to 15 Angstroms over the pinning layer; and
      a first crystalline ferromagnetic layer over the amorphous ferromagnetic layer;
   a nonmagnetic coupling layer over the pinned layer;
   a ferromagnetic fixed layer over the nonmagnetic coupling layer;
   a dielectric tunnel barrier layer over the ferromagnetic fixed layer; and
   a ferromagnetic sense layer over the dielectric tunnel barrier layer.

2. The magnetoresistive thin-film magnetic field sensor of claim 1 wherein the pinned layer further includes a second crystalline ferromagnetic layer between the amorphous ferromagnetic layer and the pinning layer.

3. The magnetoresistive thin-film magnetic field sensor of claim 2 wherein the second crystalline ferromagnetic layer comprises CoFe, where Fe is 10.0-25.0 by atomic weight.

4. The magnetoresistive thin-film magnetic field sensor of claim 2 wherein the second crystalline ferromagnetic layer has a thickness in the range of 2 to 10 Angstroms.

5. The magnetoresistive thin-film magnetic field sensor of claim 1 wherein the amorphous ferromagnetic layer comprises CoFeB, where B is 15.0 to 30.0% by atomic weight.

6. The magnetoresistive thin-film magnetic field sensor of claim 1 wherein the first crystalline ferromagnetic layer comprises CoFe, where Fe is 10.0-25.0 by atomic weight.

7. The magnetoresistive thin-film magnetic field sensor of claim 1 wherein the pinned layer and the ferromagnetic fixed layer have different magnetic moments.

8. The magnetoresistive thin-film magnetic field sensor of claim 1 wherein the ferromagnetic sense layer comprises nickel and iron.

9. The magnetoresistive thin-film magnetic field sensor of claim 1 further comprising a diffusion barrier comprising aluminum oxide over the ferromagnetic sense layer.

10. The magnetoresistive thin-film magnetic field sensor of claim 1 wherein the pinned layer comprises a thickness in the range of 10 to 40 Angstroms.

* * * * *